United States Patent
Park

(10) Patent No.: US 7,573,764 B2
(45) Date of Patent: Aug. 11, 2009

(54) CIRCUIT FOR TESTING WORD LINE OF SEMICONDUCTOR MEMORY DEVICE

(75) Inventor: Byung Kwon Park, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 2 days.

(21) Appl. No.: 11/824,843

(22) Filed: Jun. 29, 2007

(65) Prior Publication Data

US 2008/0159029 A1   Jul. 3, 2008

(30) Foreign Application Priority Data

Dec. 29, 2006   (KR) .................. 10-2006-0138765

(51) Int. Cl.
*G11C 7/00*   (2006.01)
(52) U.S. Cl. .................. 365/201; 365/230.06
(58) Field of Classification Search .............. 365/201, 365/230.06
See application file for complete search history.

(56) References Cited

U.S. PATENT DOCUMENTS

| | | | | |
|---|---|---|---|---|
| 5,596,537 A | * | 1/1997 | Sukegawa et al. | 365/201 |
| 5,901,096 A | * | 5/1999 | Inokuchi et al. | 365/201 |
| 6,115,306 A | * | 9/2000 | Shore et al. | 365/201 |
| 6,392,940 B2 | * | 5/2002 | Endo et al. | 365/201 |
| 6,438,718 B1 | | 8/2002 | Cline | |
| 6,657,915 B2 | | 12/2003 | Seo et al. | |

FOREIGN PATENT DOCUMENTS

| | | |
|---|---|---|
| KR | 10-1998-034259 | 8/1998 |
| KR | 10-0200692 B1 | 3/1999 |
| KR | 10-0223674 B1 | 7/1999 |

* cited by examiner

*Primary Examiner*—Anh Phung
(74) *Attorney, Agent, or Firm*—John P. White; Cooper & Dunham LLP

(57) ABSTRACT

A circuit for testing word lines of a semiconductor memory device, is provided which includes a first test signal generator configured to generate first test signals in response to test mode signals, a second test signal generator configured to generate a second test signal in response to the test mode signals and a word line test signal, a first address predecoder configured to output first address information signals having first address information in response to the second test signal and a first address signal, and a second address predecoder configured to output second address information signals having second address information in response to the first test signals and second address signals.

11 Claims, 6 Drawing Sheets

CIRCUIT FOR TESTING WORD LINE OF SEMICONDUCTOR MEMORY DEVICE

BACKGROUND

The present disclosure relates to a circuit for testing word lines of a semiconductor memory device, and more particularly to a circuit for testing word lines of a semiconductor memory device that is capable of effectively detecting off-leakage due to a drop of the threshold voltage when activating a word line of a semiconductor memory device.

In general, with the increasing integration and speed of a semiconductor memory device, various efforts to devise technologies and devices for storing a large amount of information in a small area are being made. In particular, high integration, low power consumption, and high speed of a semiconductor memory device are accomplished by the design of circuits and lines, and new conceptual circuit configurations.

In the initial period of developing a semiconductor memory device, the area of peripheral circuits in the memory device is larger than that of a cell array in the core region. However, as the semiconductor device is developed, the cell array occupies most of the semiconductor memory device. This tendency increases with higher integration of memory devices. With higher integration of semiconductor memory devices, a memory cell structure is changed and thus the distance between adjacent gates decreases. Accordingly, when a word line is turned on, adjacent word lines are influenced and off-leakage due to the drop of a threshold voltage occurs. The off-leakage due to the drop of the threshold voltage increases in the cells formed by different processes. Accordingly, a failure may occur upon a package test or reliability test.

BRIEF SUMMARY

In an aspect of the present disclosure, a circuit for testing word lines of a semiconductor memory device comprises a first test signal generator which generates first test signals in response to test mode signals, a second test signal generator which generates a second test signal in response to the test mode signals and a word line test signal, a first address predecoder which outputs first address information signals having first address information in response to the second test signal and a first address signal, and a second address predecoder which outputs second address information signals having second address information in response to the first test signals and second address signals.

The first address information signals may become a predetermined logic level when the second test signal is activated.

The word lines may be enabled according to the first address information signals when the second test signal is activated.

Any one of the second address information signals may become a predetermined level in response to the second address signals when the second test signal is activated.

The word lines are enabled according to the second address information signals when the second test signal is activated.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Preferred embodiments of the present invention will now be described in detail with reference to the accompanying drawings.

A circuit for testing word lines of a semiconductor memory device of an embodiment of the present invention enables prevention of a failure which occurs by off-leakage due to a drop of the threshold voltage in a semiconductor memory device, reduction of an unnecessary test time, and minimizing of test time by testing only a fourth of the word lines in a wafer test.

Figure 1:
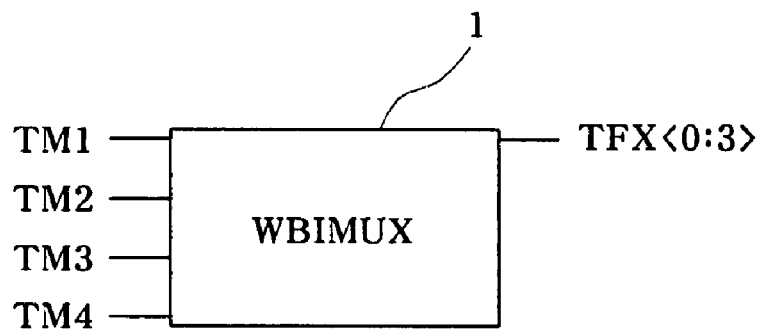
FIGS. 1 and 2 illustrate circuit diagrams showing a test signal generator according to an embodiment of the present disclosure.
Figure 2:
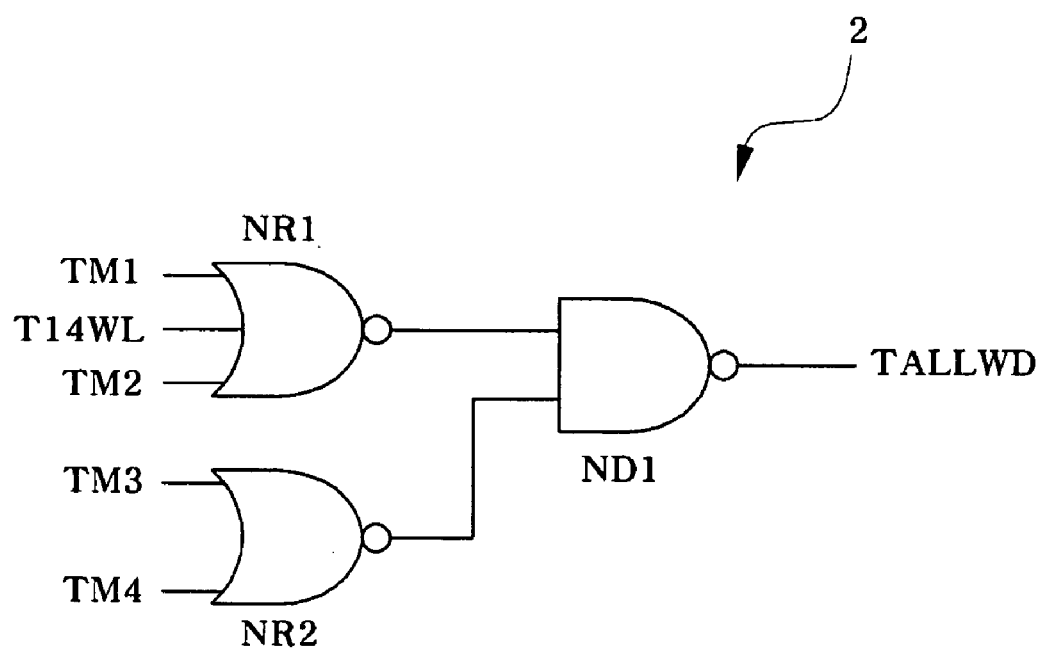
Figure 3:
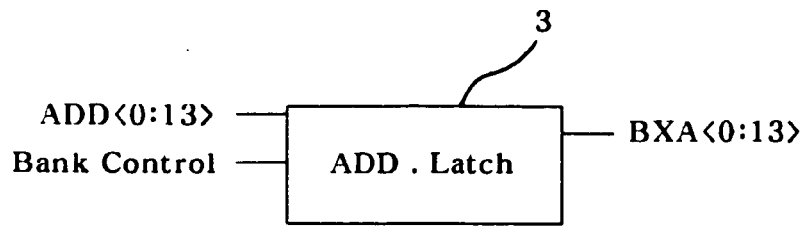
FIG. 3 illustrates a diagram showing a general address latch circuit.
Figure 4:
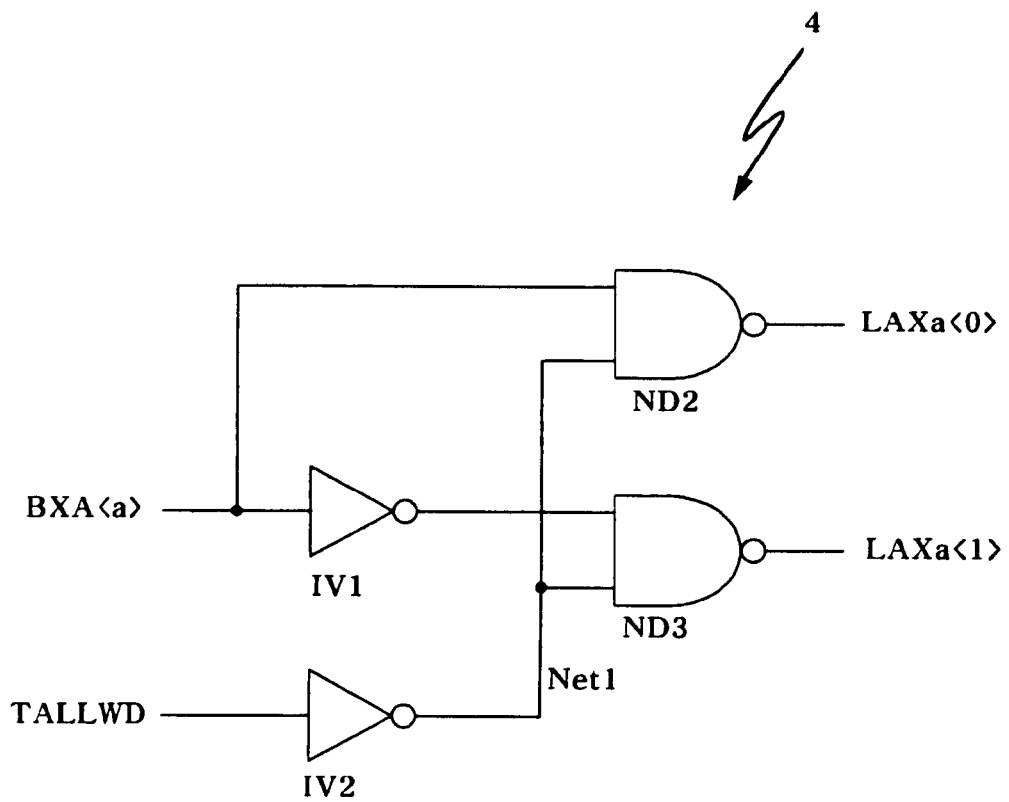
FIGS. 4 and 5 illustrate circuit diagrams showing an address predecoder according to an embodiment of the present disclosure.
Figure 5:
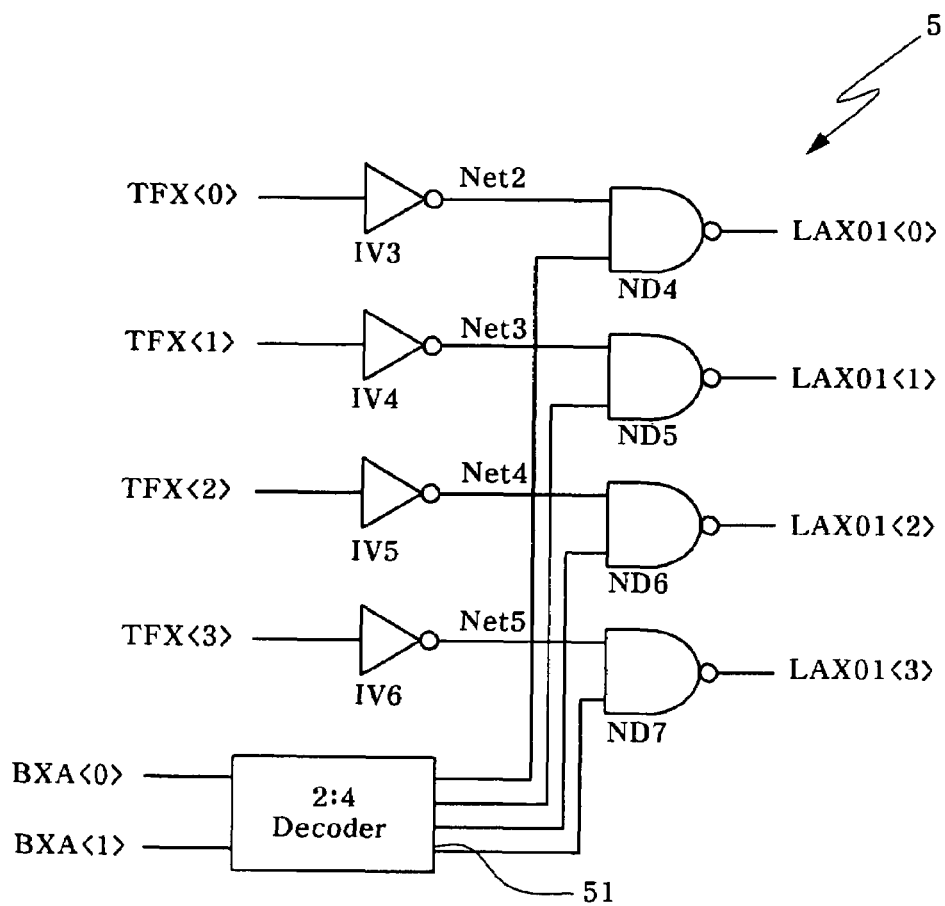
Figure 6:
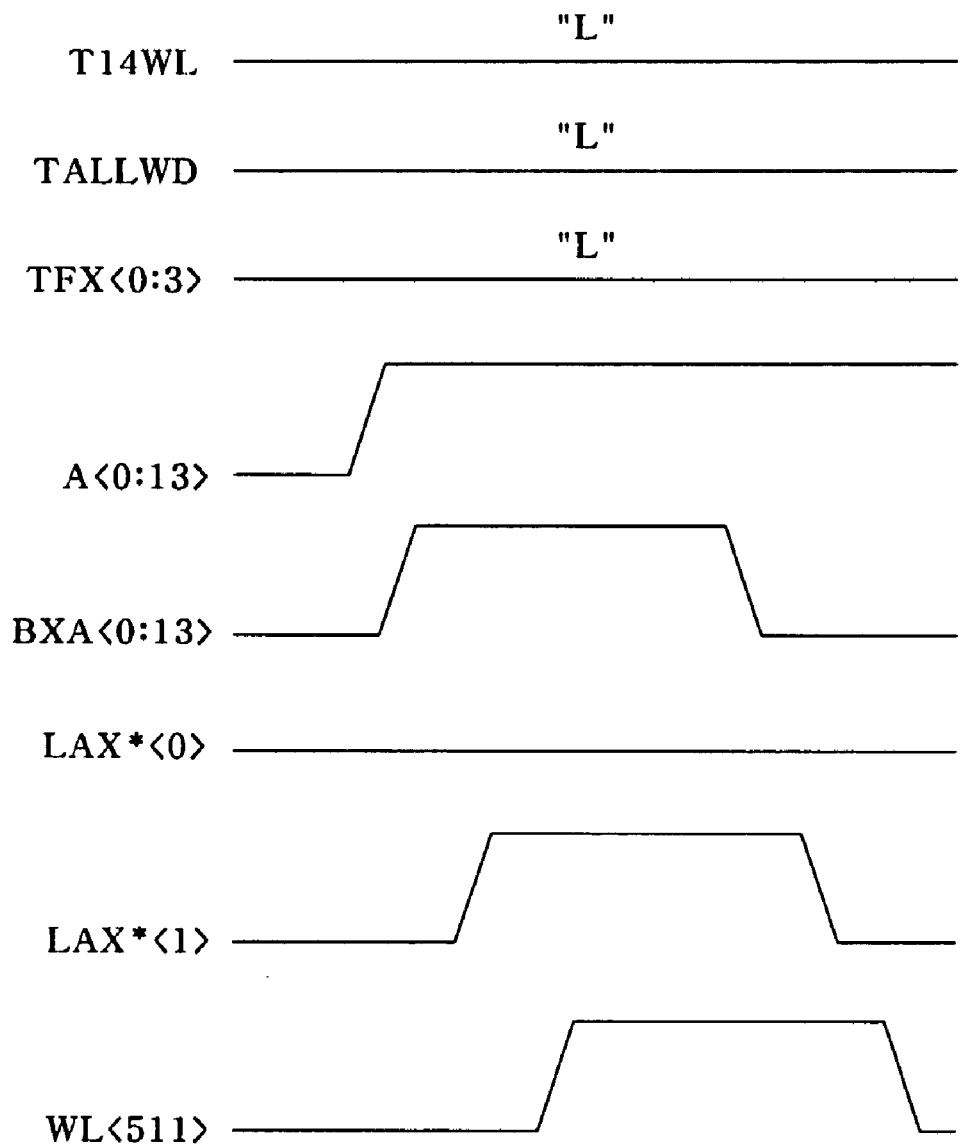
FIGS. 6 to 8 illustrate views of word line driving waveforms of test mode signals.
Figure 7:
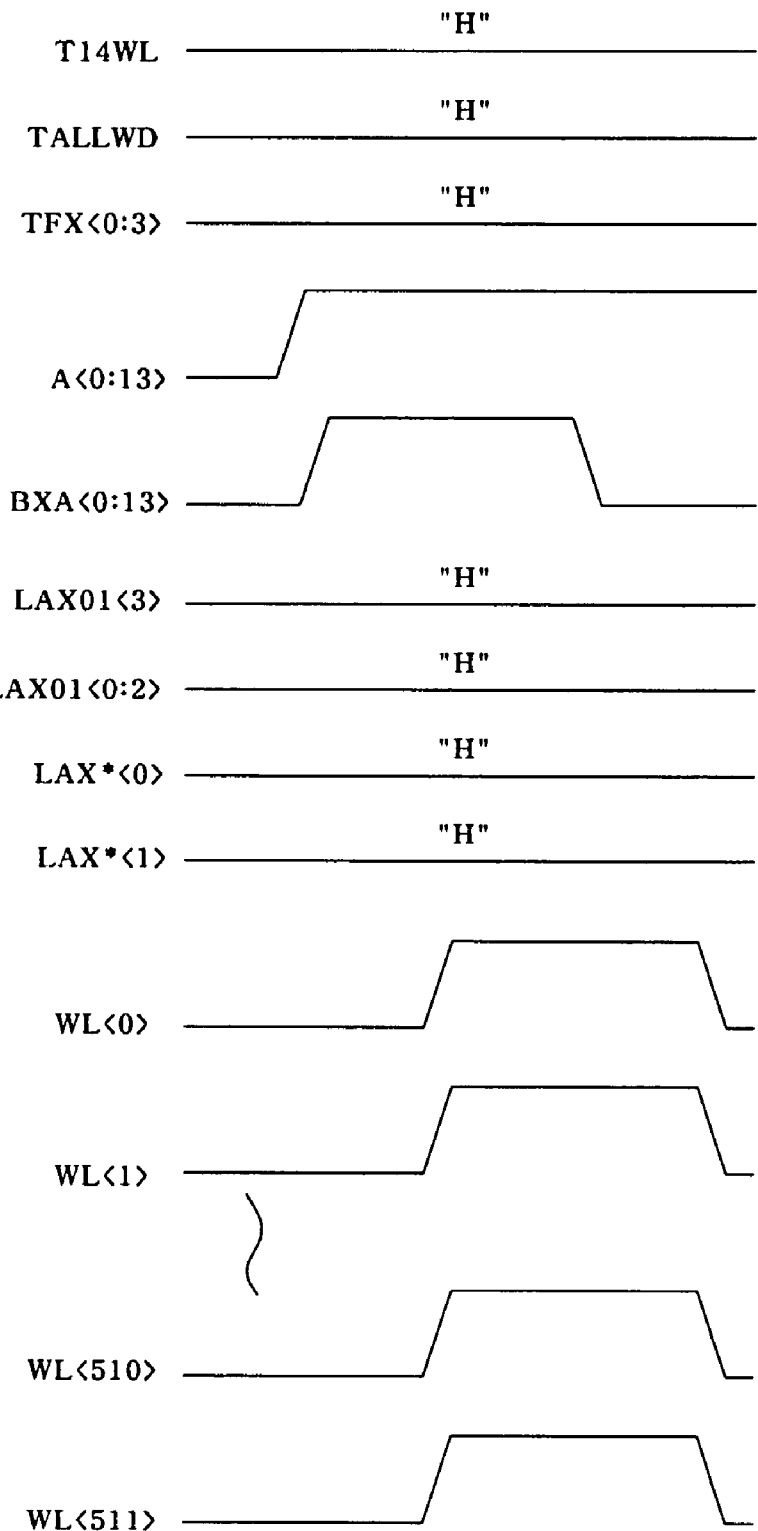
Figure 8:
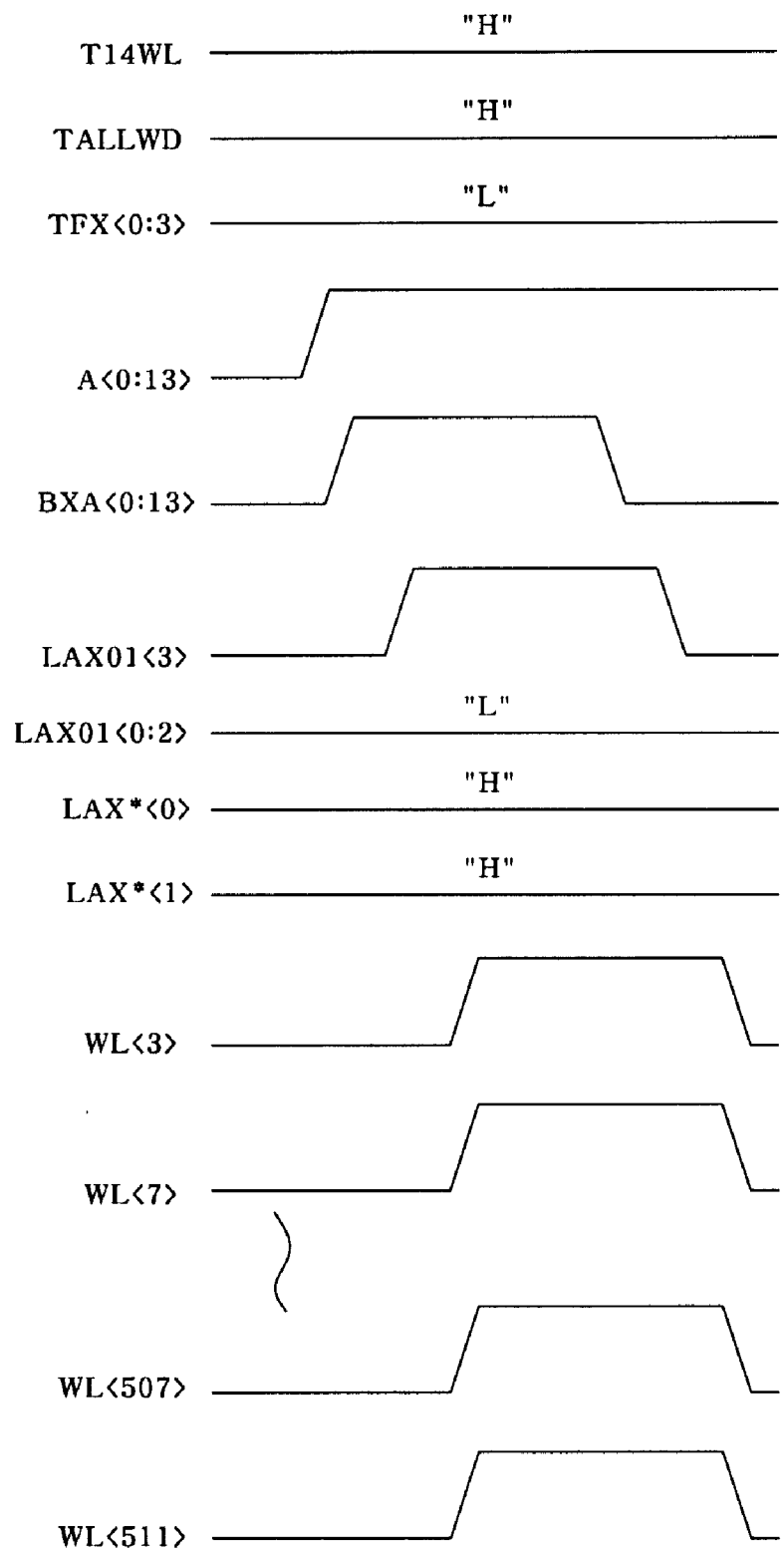

FIGS. 1 and 2 are circuit diagrams showing a test signal generator according to an embodiment of the present invention. FIG. 3 is a diagram showing a general address latch circuit. FIGS. 4 and 5 are circuit diagrams showing an address predecoder according to an embodiment of the present invention. FIGS. 6 to 8 are views of word line driving waveforms of test mode signals.

As shown in FIGS. 1 to 5, a circuit for testing word lines of a semiconductor memory device according to an embodiment of the present invention includes a first test signal generator 1 for generating first test signals TFX<0:3> in response to test mode signals TM1, TM2, TM3, and TM4, a second test signal generator 2 for generating a second test signal TALLWD in response to the test mode signals TM1, TM2, TM3, and TM4 and a word line test signal T14WL, a first address predecoder 4 for outputting first address information signals LAXa<0:1> having first address information in response to the second test signal TALLWD and a first address signal BXA<a>, and a second address predecoder 5 for outputting second address information signals LAX01<0:3> having second address information in response to the first test signals TFX<0:3> and second address signals BXA<0:1>.

Here, the first address signal BXA<a> is a 12-bit upper-level address signal (a=2 to 13) and the second address signal BXA<a> is a 2-bit lower-level address signal (a=0 and 1).

The first test signal generator 1 includes a multiplexer WBIMUX for outputting the first test signals TFX<0:3> by a combination of the inputted test mode signals TM1, TM2, TM3, and TM4. This configuration is implemented in a wafer burn-in test mode. The statuses of the first test signals TFX<0:3> are changed by the combination of the test mode signals TM1, TM2, TM3, and TM4 such that cell stress can be tested.

The second test signal generator 2 includes a NOR gate NR1 for performing a NOR operation with respect to the test mode signals TM1 and TM2 and the word line test signal T14WL, a NOR gate NR2 for performing a NOR operation with respect to the test mode signals TM3 and TM4, and a NAND gate ND1 for performing a NAND operation with respect to the signals outputted from the NOR gates NR1 and NR2.

The first address predecoder 4 includes NAND gates ND2 and ND3 for performing NAND operations with respect to the second test signal TALLWD and the first address signal BXA<a>. When the second test signal TALLWD is at a high level, the first address information signals LAXa<0:1> having the first address information become high level.

The second address predecoder 5 includes a decoder 51 for decoding the second address signals BXA<0:1> and NAND gates ND4, ND5, ND6, and ND7 for performing NAND operations with respect to the decoded address signal and the first test signals TFX<0:3>. When the first test signals TFX<0:3> are at a low level, any one of the second address information signals LAX01<0:3> having the second address information becomes high level according to the second address signals BXA<0:1>.

The circuit for testing the word lines of the semiconductor memory device according to an embodiment of the present invention operates by the following manner.

FIGS. 6 to 8 are views of word line driving waveforms of the test mode signals, according to respective examples.

First, the first test signal generator 1 generates the first test signals TFX<0:3> in response to the input test mode signals TM1, TM2, TM3, and TM4.

The second test signal generator 2 generates the second test signal TALLWD in response to the test mode signals TM1, TM2, TM3, and TM4 and the word line test signal. The second test signal is generated by the NOR gate NR1 for performing the NOR operation with respect to the test mode signals TM1 and TM2 and the word line test signal T14WL, the NOR gate NR2 for performing the NOR operation with respect to the test mode signals TM3 and TM4, and the NAND gate ND1 for performing the NAND operation with respect to the signals outputted from the NOR gates NR1 and NR2.

The first address predecoder 4 outputs the first address information signal LAXa<0:1> having the first address information in response to the second test signal TALLWD and the first address signal BXA<a>. The first address information signal LAXa<0:1> is generated by the NAND gates ND2 and ND3 for performing the NAND operations with respect to the second test signal TALLWD and the first address signal BXA<a>. For example, when the second test signal TALLWD is at a high level, the first address information signals LAXa<0:1> outputted from the first address predecoder 4 become high level.

The second address predecoder 5 outputs the second address information signals LAX01<0:3> having the second address information in response to the first test signals TFX<0:3> and the second address signals BXA01<0:1>. The second address information signals LAX01<0:3> are generated by the decoder 51 for decoding the second address signals BXA<0:1> and the NAND gates ND4, ND5, ND6 and ND7 for performing the NAND operations with respect to the decoded address signal and the first test signals TFX<0:3>. For example, when the first test signals TFX<0:3> are at a low level, any one of the second address information signals LAX01<0:3> outputted from the second address predecoder 5 becomes high level according to the second address signal BXA<0:1>.

FIGS. 6 and 8 and Tables 1 and 2 show combinations when the word line test signal T14WL is at a high level or low level.

TABLE 1

| T14WL | TFX<0> | TFX<1> | TFX<2> | TFX<3> | STATUS |
|---|---|---|---|---|---|
| L | L | L | L | L | NORMAL |
| H | L | L | L | L | ALL WL |

TABLE 2

| A<1> | A<0> | LAX01<0> | LAX01<1> | LAX01<2> | LAX01<3> |
|---|---|---|---|---|---|
| L | L | H | L | L | L |
| L | H | L | H | L | L |
| H | L | L | L | H | L |
| H | H | L | L | L | H |

When the word line test signal T14WL is at a low level, the first test signals TFX<0:3> and the second test signal TALLWD become low level and the signals NET1 to NET5 of the first and second predecoders 4 and 5 become high level. Accordingly, the signal outputted from an address latch circuit shown in FIG. 3 is received and normal driving is performed.

When the word line test signal T14WL is at a high level, the first test signals TFX<0:3> become low level and the second test signal TALLWD becomes high level. When the second test signal TALLWD is inputted to the first address information predecoder 4, both of the first address information signals LAXa<0:1> become high level.

Any one of the second address information signals LAX01<0:3> outputted from the second address predecoder 5 becomes high level according to the second address signals BXA<0:1>.

Accordingly, as shown in FIG. 8, the word lines are enabled at intervals of a predetermined number of lines. In FIG. 8, the second address information signal LAX01<3> of the second address information signals LAX01<0:3> is at a high level and the word lines WL<3>, WL<7> to WL<507> and WL<511> are enabled at intervals of the predetermined number of lines.

In a circuit for testing word lines according to the present invention, it is possible to previously prevent a failure which occurs by off-leakage due to a drop of the threshold voltage in a semiconductor memory device, reduce an unnecessary test time, and minimize the test time by testing word lines in a wafer test.

While preferred embodiments of the present invention have been disclosed for illustrative purposes, those skilled in the art will appreciate that various modifications, additions and substitutions are possible, without departing from the scope and spirit of the invention and the accompanying claims.

The present application claims priority to Korean patent application number 10-2006-0138765, filed on Dec. 29, 2006, which is incorporated by reference herein in its entirety.

What is claimed is:

1. A circuit for testing word lines of a semiconductor memory device, the circuit comprising:
    a first test signal generator configured to generate first test signals, in response to test mode signals;
    a second test signal generator configured to generate a second test signal, in response to the test mode signals and a word line test signal;
    a first address predecoder configured to generate first address information signals having first address information, in response to the second test signal and a first address signal; and
    a second address predecoder configured to output second address information signals having second address information, in response to the first test signals and second address signals.

2. The circuit according to claim 1, wherein the first address information signals become a predetermined logic level when the second test signal is activated.

3. The circuit according to claim 2, wherein the word lines are enabled according to the first address information signals when the second test signal is activated.

4. The circuit according to claim 1, wherein any one of the second address information signals becomes a predetermined level in response to the second address signals when the second test signal is activated.

5. The circuit according to claim 4, wherein the word lines are enabled according to the second address information signals when the second test signal is activated.

6. The circuit according to claim 1, wherein the first test signal generator includes a multiplexer for outputting the first test signals, and the statuses of the first test signals are changed according to a combination of the test mode signals.

7. The circuit according to claim 1, wherein the second test signal generator includes:
 a first logic gate configured to perform a NOR operation with respect to the test mode signals and the word line test signal;
 a second logic gate configured to perform a NOR operation with respect to the test mode signals; and
 a third logic gate configured to perform a NAND operation with respect to the signals outputted from the first and second logic gates.

8. The circuit according to claim 1, wherein the first address predecoder includes a logic circuit configured to perform a NAND operation with respect to the second test signal and the first address signal.

9. The circuit according to claim 1, wherein the second address predecoder includes:
 a decoder configured to decode the second address signals; and
 a logic circuit configured to perform NAND operations with respect to the decoded second address signals and the first test signal.

10. The circuit according to claim 1, wherein the first address signal is a 12-bit upper-level address signal.

11. The circuit according to claim 1, wherein the first address signal is a 2-bit lower-level address signal.

* * * * *